United States Patent
Cho et al.

(10) Patent No.: US 10,636,631 B2
(45) Date of Patent: Apr. 28, 2020

(54) SUBSTRATE TREATING APPARATUS AND INSPECTION METHOD

(71) Applicant: SEMES CO., LTD., Cheonan-si, Chungcheongnam-do (KR)

(72) Inventors: Jae Hwan Cho, Gyeonggi-do (KR); Hyung Joon Kim, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 120 days.

(21) Appl. No.: 16/053,417

(22) Filed: Aug. 2, 2018

(65) Prior Publication Data

US 2019/0043699 A1 Feb. 7, 2019

(30) Foreign Application Priority Data

Aug. 7, 2017 (KR) .................. 10-2017-0099642

(51) Int. Cl.
*H01J 37/32* (2006.01)
*H01L 21/67* (2006.01)
*G01N 21/41* (2006.01)

(52) U.S. Cl.
CPC ........ *H01J 37/32798* (2013.01); *G01N 21/41* (2013.01); *H01J 37/3244* (2013.01); *H01J 37/32568* (2013.01); *H01J 37/32715* (2013.01); *H01L 21/67069* (2013.01); *H01J 2237/24592* (2013.01); *H01J 2237/334* (2013.01)

(58) Field of Classification Search
CPC ........................................ H01J 37/32
See application file for complete search history.

(56) References Cited

FOREIGN PATENT DOCUMENTS

| | | |
|---|---|---|
| JP | 2006066855 A | 3/2006 |
| KR | 10-0247918 B1 | 12/1999 |
| KR | 10-2007-0094413 A | 9/2007 |

*Primary Examiner* — Marvin Payen
(74) *Attorney, Agent, or Firm* — Procopio, Cory, Hargreaves & Savitch LLP

(57) ABSTRACT

Disclosed is a substrate treating apparatus. The substrate treating apparatus includes a process chamber having a treatment space in the interior thereof, a support unit located in the process chamber to support a substrate, a gas supply unit configured to supply a process gas into the interior of the process chamber, a plasma generating unit including an upper electrode having a through-hole, through which the process gas flows, and a shower head having a hole, through which the process gas is ejected into the treatment space, and an inspection unit configured to inspect a coupling state of the shower head and the upper electrode while an optical fiber is interposed between the upper electrode and the shower head.

16 Claims, 7 Drawing Sheets

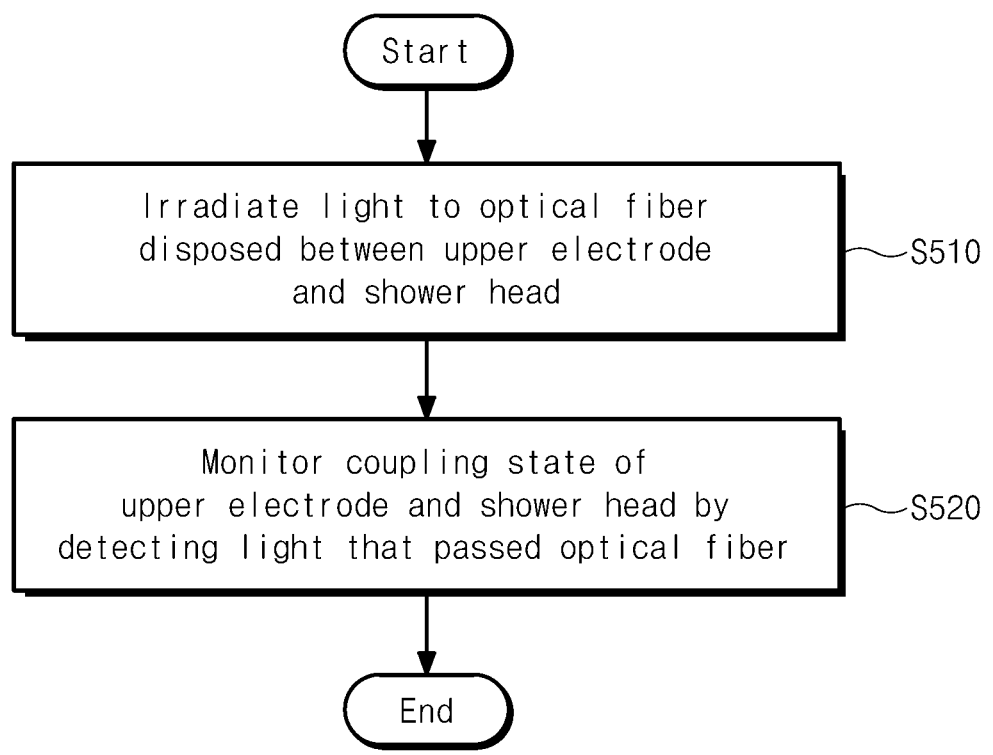

SUBSTRATE TREATING APPARATUS AND INSPECTION METHOD

CROSS-REFERENCE TO RELATED APPLICATIONS

This application claims priority under 35 U.S.C. § 119 to Korean Patent Application No. 10-2017-0099642 filed on Aug. 7, 2017, in the Korean Intellectual Property Office, the disclosures of which are incorporated by reference herein in their entireties.

BACKGROUND

Embodiments of the inventive concept described herein relate to a substrate treating method and an inspection method, and more particularly to an inspection method for inspecting a coupling state of a shower head and an upper electrode.

In order to manufacture a semiconductor device, a desired pattern is formed on au substrate by performing various processes, such as photolithography, etching, ashing, ion implantation, deposition of a thin film, and cleaning. Among them, the etching process is a process of removing a selected heating area of a film formed on a substrate, and includes wet etching and dry etching.

For dry etching, an etching apparatus using plasma is used. Generally, in order to form plasma, an electromagnetic field is formed in an interior space of a chamber and the electromagnetic field excites a process gas provided into the chamber into a plasma state.

Plasma refers to an ionized gaseous state including ions, electrons, and radicals. The plasma is generated by very high temperature, strong electric fields, or radio frequency (RF) electromagnetic fields. In the semiconductor device manufacturing process, an etching process is performed by using plasma. For the etching process, a process gas is supplied to a process chamber.

Conventionally, an assembly error of a shower head and an upper electrode is monitored through assembly of the external appearances of the shower head and the upper electrode and manual measurements so that it is difficult to accurately measure a coupling state of the shower head, and etching is performed as time passes after the shower head is exposed to plasma and it is difficult to accurately determine an exchange timing of the shower head because the shower head is exchanged when a specific time elapses arbitrarily conventionally. That is, even when the etching of the shower head is not sufficiently performed, the shower head is exchanged so that the shower head may be wasted or process efficiency may deteriorate as the shower head is exchanged after the exchange timing of the shower head has passed.

SUMMARY

Embodiments of the inventive concept provide a substrate treating apparatus and an inspection method by which a coupling state of a shower head and an upper electrode may be inspected by disposing an optical fiber between the shower head and the upper electrode.

The problems that are to be solved by the inventive concept are not limited to the above-mentioned problems, and the unmentioned problems will be clearly understood by those skilled in the art to which the inventive concept pertains from the specification and the accompanying drawings.

In accordance with an aspect of the inventive concept, there is provided a substrate treating apparatus including a process chamber having a treatment space in the interior thereof, a support unit located in the process chamber to support a substrate, a gas supply unit configured to supply a process gas into the interior of the process chamber, a plasma generating unit including an upper electrode having a through-hole, through which the process gas flows, and a shower head having a hole, through which the process gas is ejected into the treatment space, and an inspection unit configured to inspect a coupling state of the shower head and the upper electrode while the optical fiber is interposed between the upper electrode and the shower head.

The inspection unit may include an optical fiber disposed between the upper electrode and the shower head, a light source configured to irradiate light to the optical fiber, and a measurement unit configured to monitor the coupling state of the shower head and the upper electrode by detecting the light that passed through the optical fiber.

The measurement unit may calculate a phase change of the detected light, and may determine the coupling state of the shower head and the upper electrode based on the phase change of the light.

The optical fiber may be interposed between a lower groove formed on the shower head and an upper groove formed under the upper electrode.

The optical fiber may be disposed in a lower groove formed on an upper surface of the shower head in a spiral shape.

An interval between a top point of the upper groove and a bottom point of the lower groove may be smaller than a diameter of the optical fiber when the shower head and the upper electrode is closely attached to each other.

The optical fiber may be partially deformed by partially providing a pressure to the optical fiber when the shower head and the upper electrode are coupled to each other.

Sections of the upper groove and the lower groove may have partial shapes of ellipses extending in a widthwise direction.

A depth of the lower groove may be larger than a depth of the upper groove.

In accordance with another aspect of the inventive concept, there is provided an inspection method including inspecting a coupling state of a shower head and an upper electrode provided on the shower head by an apparatus for treating a substrate by supplying a gas through a hole formed in the shower head, disposing an optical fiber between the upper electrode and the shower head, and monitoring the coupling state of the shower head and the upper electrode by detecting light irradiated to the optical fiber.

The monitoring of the coupling state may include calculating a phase change of the detected light and determining the coupling state of the shower head and the upper electrode based on the calculated phase change of the light.

The monitoring of the coupling state may be performed before the shower head and the upper electrode are coupled to each other and a process is executed.

The monitoring of the coupling state may be performed while the substrate is treated by supplying the gas to the substrate after the shower head and the upper electrode are coupled to each other.

The supply of the gas may be stopped when the coupling state of the shower head and the upper electrode is abnormal.

In accordance with another aspect of the inventive concept, there is provided a substrate treating apparatus including a process chamber having a treatment space in the interior thereof, a support unit located in the process chamber to support a substrate, a gas supply unit configured to supply a process gas into the interior of the process chamber, a plasma generating unit configured to generate plasma by using the process gas, a ring assembly including an insulation ring that surrounds a circumference of the support unit and a focusing ring that concentrates the plasma on the substrate, and an inspection unit configured to inspect a coupling state of the insulation ring and the focusing ring while the optical fiber is interposed between the insulation ring and the focusing ring.

In accordance with another aspect of the inventive concept, there is provided an inspection method including inspecting a coupling state of an insulation ring and a focusing ring provided on the insulation ring by a substrate treating apparatus for supporting a peripheral area of a substrate by a ring assembly including the insulation ring and the focusing ring, disposing an optical fiber between the insulation ring and the focusing ring, and monitoring the coupling state of the insulation ring and the focusing ring by detecting light irradiated to the optical fiber.

BRIEF DESCRIPTION OF THE FIGURES

The above and other objects and features of the inventive concept will become apparent by describing in detail exemplary embodiments thereof with reference to the accompanying drawings.

FIG. 8 is a flowchart illustrating an inspection method according to an embodiment of the inventive concept.

DETAILED DESCRIPTION

Figure 1:
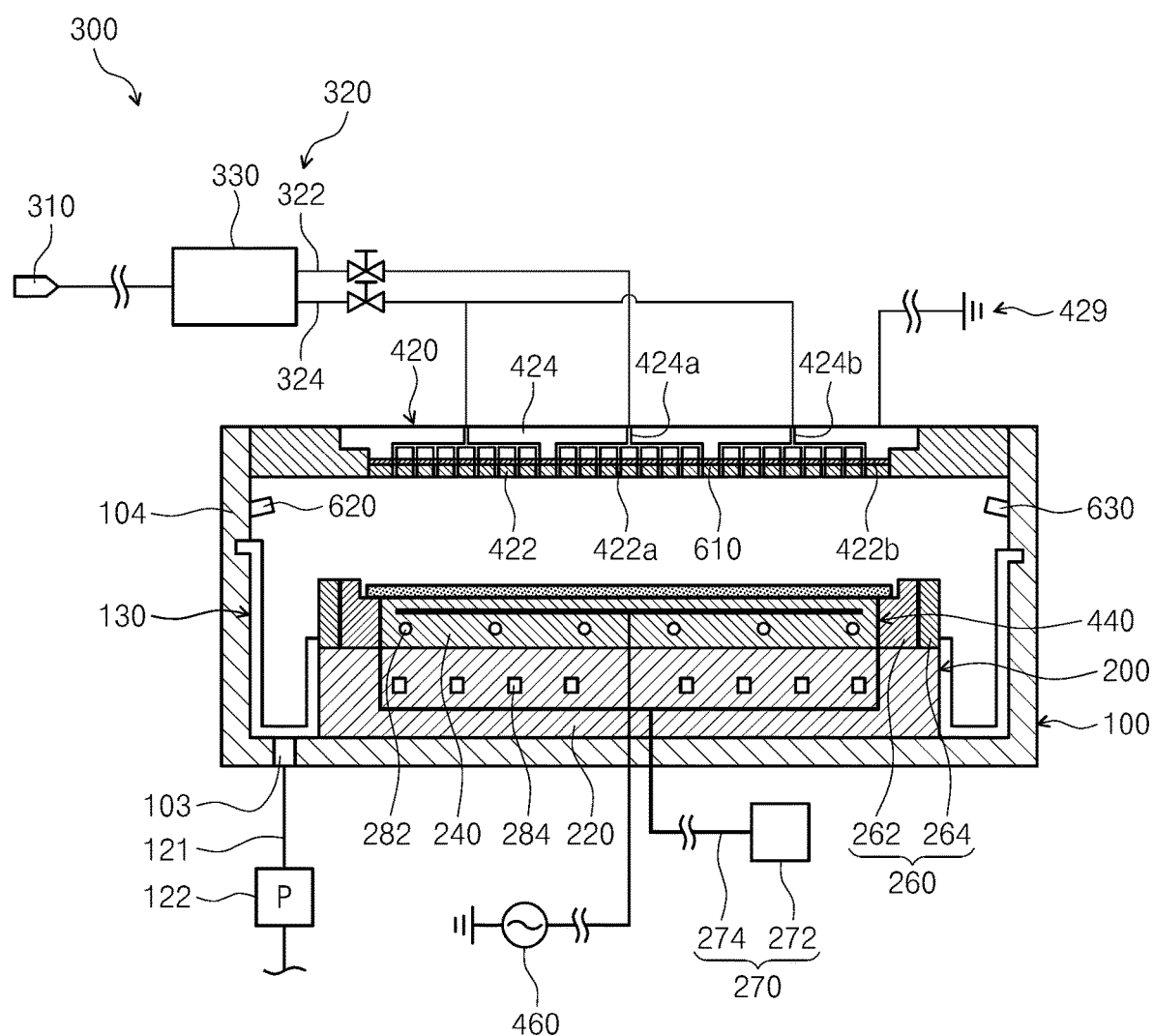
FIG. 1 is a sectional view illustrating a substrate treating apparatus according to an embodiment of the inventive concept.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

In an embodiment of the inventive concept, a substrate treating apparatus for cleaning a substrate by using plasma will be described. However, the inventive concept is not limited thereto, but may be applied to various types of apparatuses that heats a substrate positioned thereon.

Further, in the embodiment of the inventive concept, an electrostatic chuck will be described as an example of a support unit. However, the inventive concept is not limited thereto and the support unit may support a substrate through mechanical clamping or by using vacuum.

FIG. 1 is a sectional view illustrating a substrate treating apparatus 10 according to an embodiment of the inventive concept. The substrate treating apparatus 10 treats a substrate W by using plasma. In the embodiment of the inventive concept, an apparatus for etching a substrate W by using plasma will be described as an example. However, the technical feature of the inventive concept is not limited thereto, and may be applied to various types of apparatuses that treat a substrate W by using plasma.

Referring to FIG. 1, the substrate treating apparatus 10 has a process chamber 100, a liner unit 130, a support unit 200, a gas supply unit 300, a plasma generating unit 400, and an inspection unit 600.

The process chamber 100 has a space for performing a process in the interior thereof. An exhaust hole 103 is formed on a bottom surface of the process chamber 100. The exhaust hole 103 is connected to an exhaust line 121, on which a pump 122 is mounted. The reaction side-products generated in the process and the gases that stay in the interior of the process chamber 100 are exhausted to the exhaust hole 103 through the exhaust line 121. Accordingly, they may be discharged to the outside of the process chamber 100. Further, the pressure of the interior space of the process chamber 100 is reduced to a specific pressure through the exhaustion process. As an example, the exhaust hole 1303 may be provided at a location that is directly communicated with a through-hole 150 of the liner unit 130, which will be described below.

An opening 104 is formed in a side wall of the process chamber 100. The opening 104 functions as a passage, through which a substrate is introduced and extracted into and from the process chamber 100. The opening 104 is opened and closed by a door assembly (not illustrated). According to an embodiment, the door assembly (not illustrated) has an outer door, an inner door, and a connecting plate. The outer door is provided in the outer wall of the process chamber. The inner door is provided in the inner wall of the process chamber. The outer door and the inner door are fixedly coupled to each other by the connecting plate. The connecting plate extends from an inside to an outside of the process chamber through the opening. A door driver moves the outer door upwards and downwards. The door driver may include a hydraulic/pneumatic cylinder or a motor.

The support unit 200 is located in a lower area of the interior of the process chamber 100. The support unit 200 supports the substrate W by using an electrostatic force. Unlike this, the support unit 200 may support the substrate W in various schemes, such as mechanical clamping.

The support unit 200 has a support plate 210, a ring assembly 260, and a gas supply liner part 270. The substrate S is positioned on the support plate 210. The support plate 210 has a base 220 and an electrostatic chuck 240. The electrostatic chuck 240 supports the substrate W on an upper surface thereof by using an electrostatic force. The electrostatic chuck 240 is fixedly coupled onto the base 220.

The ring assembly 260 has a ring shape. The ring assembly 260 is provided to surround a circumference of the support plate 210. As an example, the ring assembly 260 is provided to surround a circumference of the electrostatic chuck 240. The ring assembly 260 supports a peripheral area of the substrate W. According to an embodiment, the ring assembly 260 has a focusing ring 262 and an insulation ring 264. The focusing ring 262 is provided to surround the electrostatic chuck 240, and concentrates plasma on the substrate W. The insulation ring 264 is provided to surround the focusing ring 262. Selectively, the ring assembly 260 may include an edge ring (not illustrated) that is provided at a circumference of the focusing ring 262 to be closely attached to the focusing ring 262 so that a side surface of the electrostatic chuck 240 may be prevented from being damaged by plasma. Differently from the above-mentioned one, the structure of the ring assembly 260 may be variously changed.

The gas supply line part 270 includes a gas supply source 272 and a gas supply line 274. The gas supply line 274 is provided between the ring assembly 260 and the support plate 210. The gas supply line 274 supplies a gas to remove foreign substances that stay on an upper surface of the ring assembly 260 or in a peripheral area of the support plate 210. For example, the gas may be a nitrogen gas ($N_2$). Selectively, another gas or a cleaning agent may be supplied. The gas supply line 274 may be formed to connect the focusing ring 262 and the electrostatic chuck 240 in the interior of the support plate 210. Unlike this, the gas supply line 274 may be provided in the interior of the focusing ring 262, and may be bent to connect the focusing ring 262 and the electrostatic chuck 240.

According to an embodiment, the electrostatic chuck 240 may be formed of a ceramic material, the focusing ring 262 may be formed of a silicon material, and the insulation ring 264 may be formed of a quartz material. A heating member 282 and a cooling member 284 that maintains the substrate W at a process temperature during a process may be provided to the electrostatic chuck 240 or the base 220. A plurality of heating members 282 may be heating wires. The cooling member 284 may be a cooling line, through which a refrigerant flows. According to an embodiment, the heating member 282 may be provided in the electrostatic chuck 240, and the cooling member 284 may be provided in the base 220.

The gas supply unit 300 supplies a process gas into the process chamber 100. The gas supply unit 300 includes a gas storage unit 310, a gas supply line 320, and a distributor 330. The gas supply line 320 connects the gas storage unit 310 and a gas introduction port (not illustrated). The gas supply line 320 supplies the process gas stored in the gas storage unit 310 to the gas introduction port (not illustrated). As an example the gas introduction port may be formed on an upper electrode 420. Selectively, the gas supply line 320 may supply the process gas onto the upper electrode 420. A valve 322 for opening and closing the passage or adjusting the flow rate of the fluid flowing through the passage may be installed in the gas supply line 320.

The gas supply line 320 may have a central gas supply line 322 and a peripheral gas supply line 324. The central gas supply line 322 supplies the process gas to a central area of the upper electrode 420. The peripheral gas supply line 324 supplies the process gas to a peripheral area of the upper electrode 420. The distributor 330 may distribute the amounts of the process gas supplied to the central gas supply line 322 and the peripheral gas supply line 324.

The plasma generating unit 400 generates plasma from the process gas that stays in a discharge space. The discharge space corresponds to an upper area of the support unit 200 in the process chamber 100. The plasma generating unit 400 may have a capacitive coupled plasma source.

The plasma generating unit 400 has an upper electrode part 420, a lower electrode 440, and a high-frequency power source 460. The upper electrode part 420 and the lower electrode 440 are provided to face each other upwards and downwards. The upper electrode part 420 has a shower head 422 and an upper electrode 424. The shower head 422 may be located to face the electrostatic chuck 240, and may have a diameter that is larger than that of the electrostatic chuck 240. The shower head 422 has holes 422a and a coupling member 422b. The process gas is ejected through the holes 422a. The coupling member 422b couples the shower head 422 and the upper electrode 424. A plurality of coupling members 422 may be provided. The coupling member 422b may be a bolt. Selectively, the coupling member 422b may be another type of coupling member. The upper electrode 424 is provided on the shower head 422. The upper electrode 424 is provided to face the shower head 422, and is coupled to the shower head 422. The upper electrode 424 is provided to contact the shower head 422 to be electrically connected to the shower head 422. Through-holes 424a and 424b, through which the process gas flows, are formed in the interior of the upper electrode 424. Referring to FIG. 1 again, the through-holes 424a and 424b may be a central through-hole 424a communicated with the central gas supply line 322 and a peripheral through-hole 424b communicated with the peripheral gas supply line 324. According to an example, the shower head 422 may be formed of silicon. Selectively, the shower head 422 may be formed of a metallic material.

The lower electrode 440 may be provided in the electrostatic chuck 240. According to an embodiment, the upper electrode part 420 may be grounded 429, and the high-frequency power source 460 may be connected to the lower electrode 440. Selectively, the high-frequency power source 460 may be connected to the upper electrode part 420 and the lower electrode 440 may be grounded. Further, selectively, the high-frequency power source 460 may be connected to both of the upper electrode part 420 and the lower electrode 440. According to an embodiment, the high-frequency power source 460 may continuously apply electric power to the upper electrode part 420 or the lower electrode 440 or may apply electric power to the upper electrode part 420 or the lower electrode 440 with pulses.

The inspection unit 600 includes an optical fiber 610, a light source 620, and a measurement unit 630. The inspection unit 600 may inspect a coupling state of the shower head 422 and the upper electrode 424 by using light. In detail, the optical fiber 610 may be disposed between the upper electrode 424 and the shower head 422, and the measurement unit 630 may detect light that passed through the optical fiber 610 and monitor a coupling state of the shower head 422 and the upper electrode 424 if the light irradiated from the light source 620 passes through the optical fiber 610.

The inspection unit 600 may calculate a phase change of the detected light, and may determine the coupling state of the shower head 422 and the upper electrode 424 based on the phase change of the light. For example, the inspection unit 600 may determine that the coupling state of the shower head 422 and the upper electrode 424 is abnormal when the phase change of the detected light exceeds a preset value. In the inspection unit 600, the light source 620 may be installed on one side of the process chamber 100 and the measurement unit 630 may be installed on an opposite side of the light source 620 so that the light that was irradiated from the light source 620 and passed through the optical fiber 610 may be received. However, the inventive concept is not limited thereto, and the light source 620 and the measurement unit 630 may be installed at various locations at which light may be irradiated to the optical fiber 610 and the light that passed through the optical fiber 610 may be received. Further, the optical fiber 610 may be provided on an upper surface of the shower head 422 in a spiral shape.

As another example, the optical fiber 610 according to an embodiment of the inventive concept may be disposed between the focusing ring 262 and the insulation ring 264, and the inspection unit 600 may inspect the coupling state of the focusing ring 262 and the insulation ring 264. In detail, the optical fiber 610 may be disposed between the focusing ring 262 and the insulation ring 264, and the measurement unit 630 may detect light that passed through the optical fiber 610 and monitor a coupling state of the focusing ring 262 and the insulation ring 264 if the light irradiated from the light source 620 passes through the optical fiber 610.

As another example, the optical fiber 610 may be disposed under the insulation ring 264, and the inspection unit 600 may inspect an assembly parallel degree of the insulation ring 264. That is, the optical fiber 610 may be disposed in the focusing ring 262 and the insulation ring 264, in addition to shower head 422 and may inspect the coupling state of the focusing ring 262 and the insulation ring 264 or inspect whether the assembly parallel degree of the insulation ring 264 is problematic, and in addition, the optical fiber 610 may be disposed in various parts in the substrate treating apparatus 10 and may monitor whether the coupling state is normal or not.

In this way, the inspection unit 600 according to an embodiment of the inventive concept may accurately inspect the coupling state of the shower head 422 and the upper electrode 424 and the coupling state of the focusing ring 262 and the insulation ring 264 by detecting the light that passed through the optical fiber 610 while the optical fiber 610 is disposed in the shower head 422, the focusing ring 262, and the like.

Figure 2:
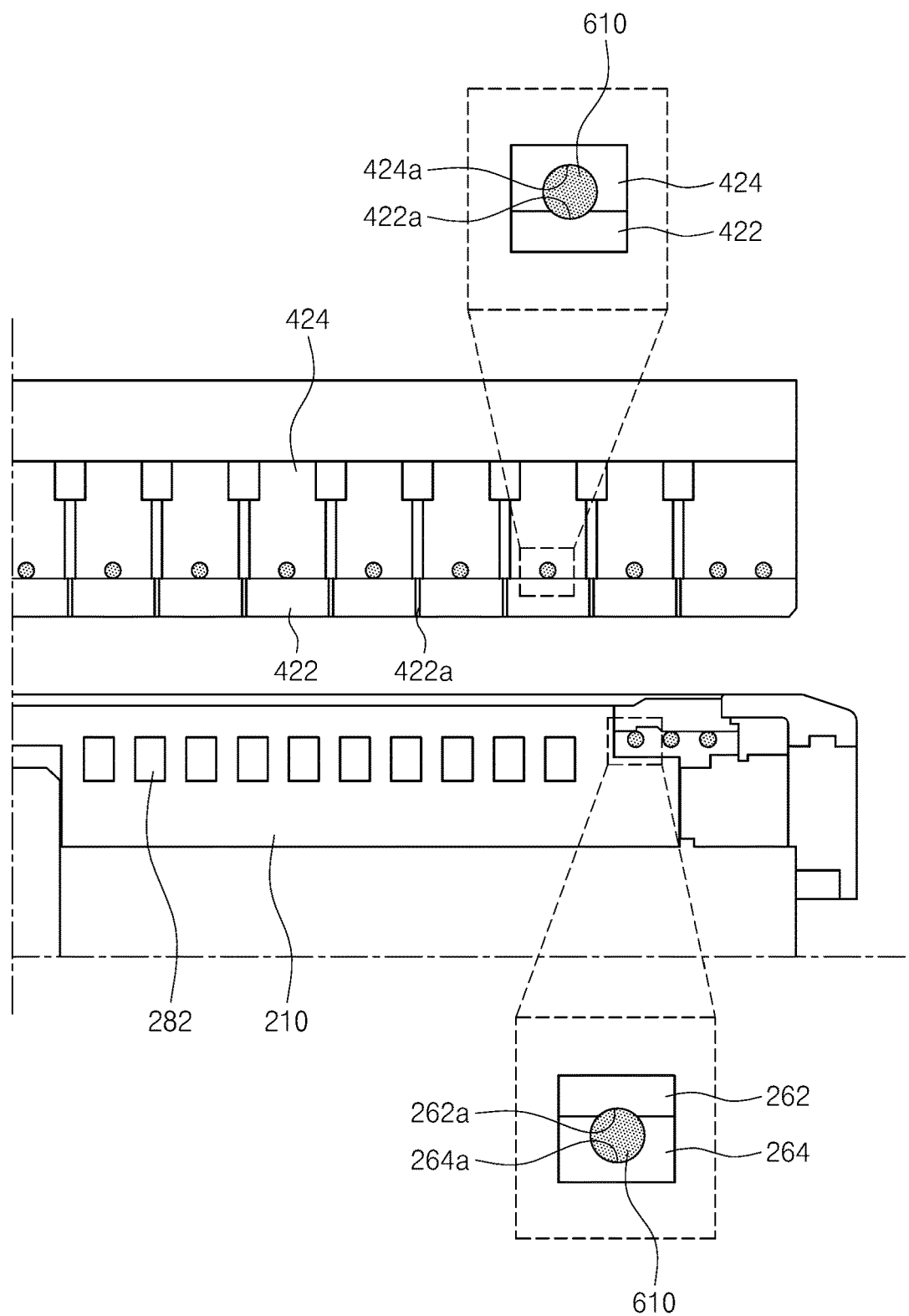
FIG. 2 is a view illustrating a disposition location of an optical fiber according to an embodiment of the inventive concept.

FIG. 2 is a view illustrating a disposition location of an optical fiber according to an embodiment of the inventive concept.

As an example, the optical fiber 610 may be disposed between the shower head 422 and the upper electrode 424. In detail, a plurality of grooves 424a may be formed under the upper electrode 424, and a plurality of grooves 422a may be formed on the shower head 422. The optical fiber 610 may be disposed between the plurality of grooves 422a and 424a. The plurality of grooves 422a formed in the shower head 422 may be formed between the plurality of holes of the shower head 422.

Figure 3:
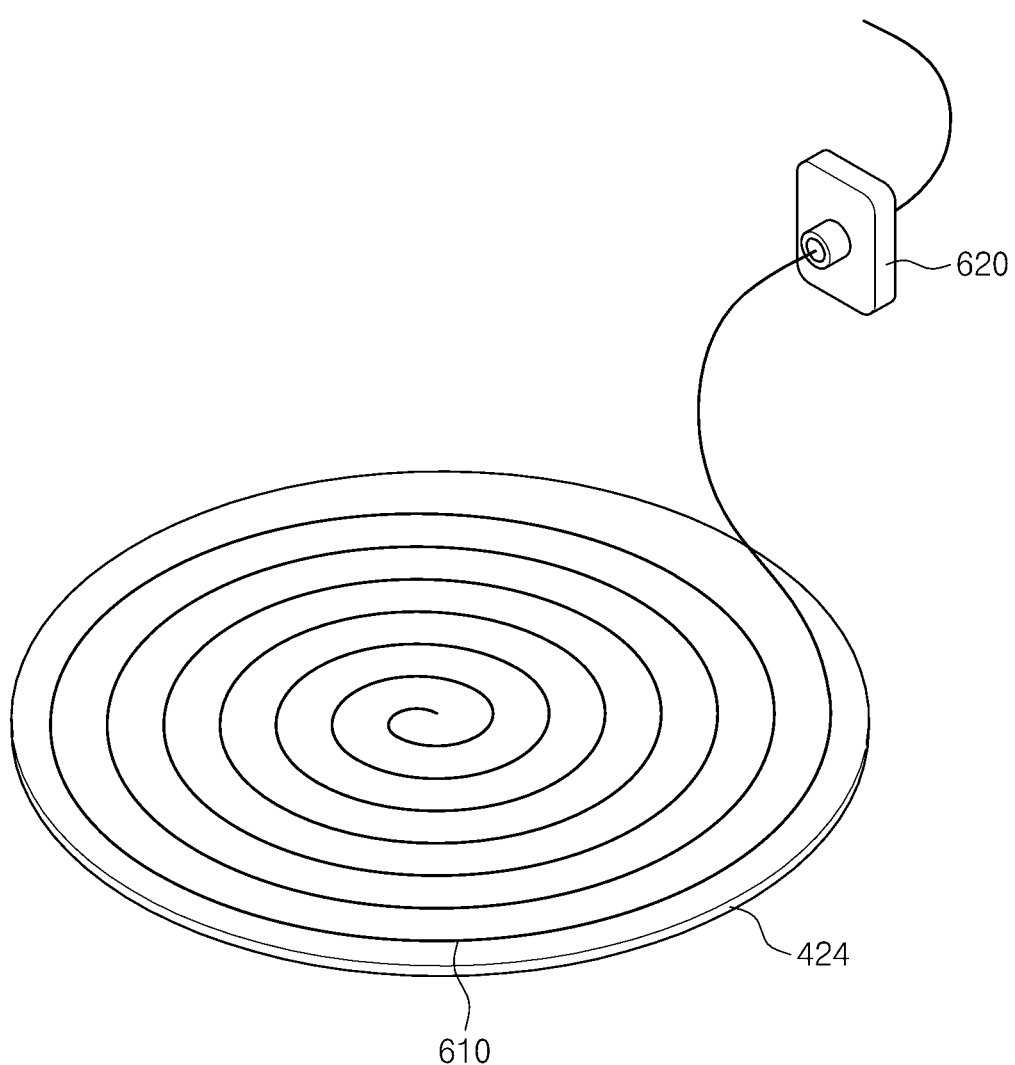
FIG. 3 is a view illustrating a form in which an optical fiber is disposed in an upper electrode according to an embodiment of the inventive concept.

The groove 422a formed in the shower head 422 may have a spiral shape when viewed from the top of the shower head 422 as in FIG. 3. That is, a spiral groove may be formed when viewed from the top of the shower head 422, and the optical fiber 610 may be disposed in the groove 422a formed in the shower head 422 in a spiral shape. Accordingly, a location at which the coupling state of the shower head 422 and the upper electrode 424 is abnormal may be accurately determined by detecting the light that passed through the optical fiber 610. Further, differently from the one illustrated in the drawings, the groove 422a formed in the shower head 422 may have a ring shape and the optical fiber 610 may have a ring shape.

As another example, the optical fiber 610 may be disposed between the focusing ring 262 and the insulation ring 264. A plurality of grooves 264a may be formed on the insulation ring 264, a plurality of grooves 262a may be formed under the focusing ring 262, and an optical fiber 610 may be disposed between the plurality of grooves 262a and 264a. Further, the plurality of grooves 264a formed in the insulation ring 264 may be spaced apart from each other by a specific distance, and may have a spiral shape when viewed from the top. Accordingly, the optical fiber 610 may be disposed between the focusing ring 262 and the insulation ring 264 in a spiral shape, and a location at which the coupling state of the focusing ring 262 and the insulation ring 264 may be accurately determined.

Hereinafter, the shower head 422 and the insulation ring 264 will be referred to as a lower plate 720 and the upper electrode 424 and the focusing ring 262 will be referred to as an upper plate 710. Further, the groove formed in the upper plate 710 will be referred to as an upper groove 710a and the groove formed in the lower plate 720 will be referred to as a lower groove 720a.

The upper grooves 710a and the lower grooves 720a may have sectional shapes that are similar to a semicircle. Further, when the upper plate 710 and the lower plate 720 contact each other, an interval between a top point of the upper groove 710a and a bottom point of the lower groove 720a may be smaller than the diameter of the optical fiber 610. This is because a gap between the upper groove 710a or the lower groove 720a may be prevented by the structure when the upper plate 710 and the lower plate 720 are coupled to each other to be spaced apart from each other.

Further, when the upper plate 710 and the lower plate 720 contact each other or are coupled to each other closely, an interval between a top point of the upper groove 710a and a bottom point of the lower groove 720a may be smaller than the diameter of the optical fiber 610 and the optical fiber 610 is deformed by an upward/downward force. In this way, when the coupling state of the upper plate 710 and the lower plate 720 is not uniform and the spacing distance between the upper plate 710 and the lower plate 720 becomes different, the shape of the light that travels along the optical fiber 610 changes. Through the phase change of the light, it may be inspected whether the coupling state of the upper plate 710 and the lower plate 720 is normal or not.

Figure 4:
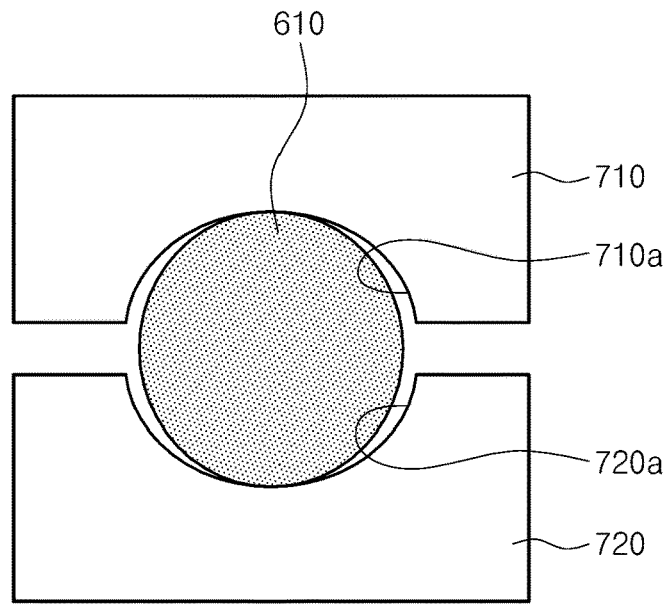
FIG. 4 is a view illustrating a first modification, in which a shape of a groove in which an optical fiber is disposed is different.
Figure 5:
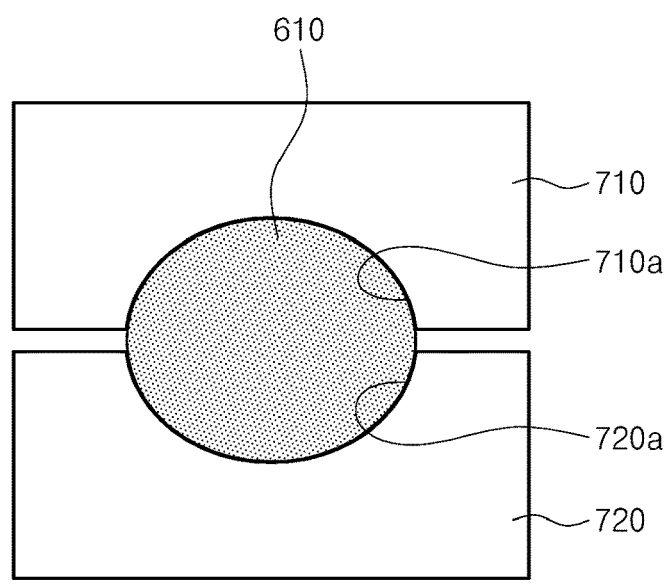
FIG. 5 is a view illustrating an appearance in which an optical fiber is deformed in FIG. 4.

FIG. 4 is a view illustrating a first modification, in which a shape of a groove in which an optical fiber is disposed is different. FIG. 5 is a view illustrating an appearance in which an optical fiber is deformed in FIG. 4.

Referring to FIGS. 4 and 5, the sections of the upper groove 710a and the lower groove 720a may have a part of an elliptical shape extending in a widthwise direction. Accordingly, a spacing space is formed on a side surface of the optical fiber 610 having a circular section. This is for allowing the optical fiber 610 to be deformed by an upward/downward pressure when the upper plate 710 and the lower plate 720 are coupled to each other.

Referring to FIG. 5, if the upper plate 710 and the lower plate 720 contact each other or are coupled to each other closely, the section of the optical fiber 610 may be deformed to have an elliptical shape.

Figure 6:
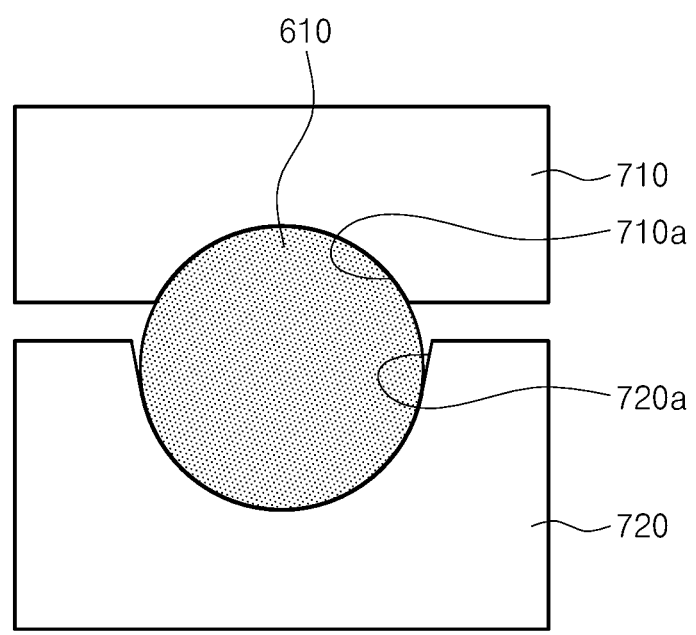
FIG. 6 is a view illustrating a second modification, in which a shape of a groove in which an optical fiber is disposed is different.

FIG. 6 is a view illustrating a second modification, in which a shape of a groove in which an optical fiber is disposed is different.

Referring to FIG. 6, the depth of the lower groove 720a may be larger than the depth of the upper groove 710a. Further, the diameter of the inlet of the lower groove 720a may be the same as or larger than the diameter of the optical fiber 610 such that the optical fiber 610 having a circular section may be easily inserted into the inlet of the lower groove 720a. The depth of the lower groove 720a is made to be larger than the depth of the upper groove 710a to prevent the optical fiber 610 from deviating due to a force applied to a lateral side when the upper plate 710 and the lower plate 720 are coupled to each other. Meanwhile, different from the drawing, the upper groove 710*a* may be deleted.

Next, a method for inspecting a coupling state of the shower head 422 and the upper electrode 422 by the inspection unit 600 will be described.

Figure 7:
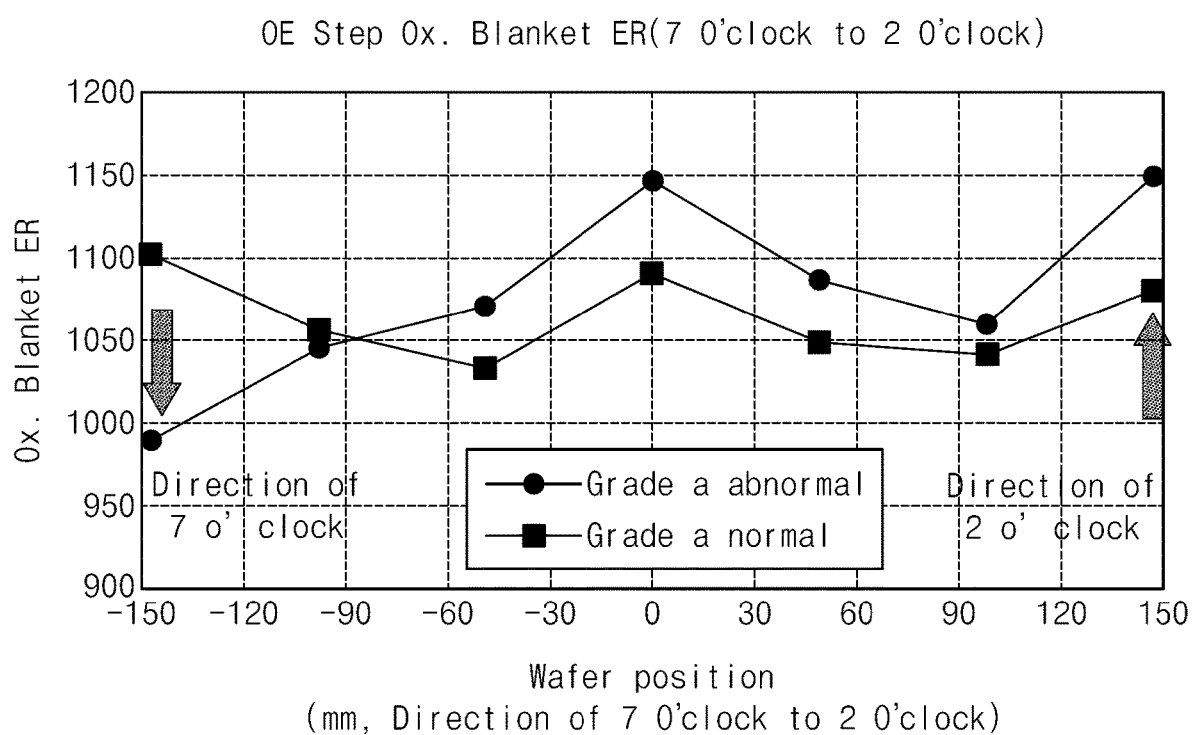
FIG. 7 is a view illustrating a result obtained by measuring light that passed through an optical fiber according to an embodiment of the inventive concept.

FIG. 7 is a view illustrating a result obtained by measuring light that passed through an optical fiber according to an embodiment of the inventive concept.

For example, referring to FIG. 7, when the coupling state of the shower head 422 and the upper electrode 424 in the direction of 7 O'clock of the upper electrode 424 is abnormal, the phase change of the light detected by the inspection unit 600 may occur in the direction of 7 O'clock and 2 O'clock that is an opposite side of 7 O'clock. That is, because the phase of the light that passes through a location at which the coupling state of the shower head 422 and the upper electrode 424 is problematic changes and the phase of the light that passes through the corresponding location due to an asymmetry of the coupling state of the shower head 422 and the upper electrode 424 changes on the opposite side of the location at which the coupling state is problematic if the coupling state of the shower head 422 and the upper electrode 424 is problematic, the inspection unit 600 may determine whether the coupling state of the shower head 422 and the upper electrode is abnormal or not, based on the phase change of the light.

FIG. 8 is a flowchart illustrating an inspection method according to an embodiment of the inventive concept.

First, light is irradiated to an optical fiber disposed between the upper electrode and the shower head (S510).

Subsequently, if the light irradiated to the optical fiber passes the optical fiber, the coupling state of the shower head and the upper electrode is monitored by detecting the light that passes through the optical fiber (S520). In detail, the phase change of the light that passed through the optical fiber may be calculated, and the coupling state of the shower head and the upper electrode may be determined based on the phase change of the light.

As mentioned above, according to various embodiments of the inventive concept, the coupling state of the shower head and the upper electrode may be monitored easily and accurately by detecting the light that passed through the optical fiber while the optical fiber is disposed between the upper electrode and the shower head.

Meanwhile, a non-transitory computer readable medium in which a program that sequentially performs the inspection method according to an embodiment of the inventive concept may be provided.

The non-transitory computer readable medium refers not to a medium, such as a register, a cache, or a memory, which stores data for a short time but to a medium that stores data semi-permanently and is read by a computer. In detail, the above-mentioned various applications or programs may be stored in a non-transitory computer readable medium, such as a CD, a DVD, a hard disk, a Blu-ray disc, a USB, a memory card, or an ROM.

Although it has been in the embodiments that an etching process is performed by using plasma, the substrate treating process is not limited thereto, but may be applied to various substrate treating processes that use plasma, such as a deposition process, an ashing process, and a cleaning process. Further, in the present embodiment, the structure in which the plasma generating unit is a capacitive coupled plasma source. However, unlike this, the plasma generating unit may be an inductively coupled plasma (ICP) device. The inductively coupled plasma device may include an antenna. Further, the substrate treating apparatus may further include a plasma border restricting unit. As an example, the plasma border restricting unit may have a ring shape, and may be provided to surround a discharge space to restrain plasma from being discharged to the outside.

As mentioned above, according to various embodiments of the inventive concept, the coupling state of the shower head and the upper electrode may be monitored easily and accurately by detecting the light that passed through the optical fiber while the optical fiber is disposed between the upper electrode and the shower head.

The above description is a simple exemplification of the technical spirit of the present disclosure, and the present disclosure may be variously corrected and modified by those skilled in the art to which the present disclosure pertains without departing from the essential features of the present disclosure. Therefore, the disclosed embodiments of the inventive concept do not limit the technical spirit of the inventive concept but are illustrative, and the scope of the technical spirit of the inventive concept is not limited by the embodiments of the present disclosure. The scope of the present disclosure should be construed by the claims, and it will be understood that all the technical spirits within the equivalent range fall within the scope of the present disclosure.

What is claimed is:

1. A substrate treating apparatus comprising:
 a process chamber having a treatment space in the interior thereof;
 a support unit located in the process chamber to support a substrate;
 a gas supply unit configured to supply a process gas into the interior of the process chamber;
 a plasma generating unit including an upper electrode having a through-hole, through which the process gas flows, and a shower head having a hole, through which the process gas is ejected into the treatment space; and
 an inspection unit configured to inspect a coupling state of the shower head and the upper electrode while an optical fiber is interposed between the upper electrode and the shower head.

2. The substrate treating apparatus of claim 1, wherein the inspection unit includes:
 the optical fiber disposed between the upper electrode and the shower head;
 a light source configured to irradiate light to the optical fiber; and
 a measurement unit configured to monitor the coupling state of the shower head and the upper electrode by detecting the light that passed through the optical fiber.

3. The substrate treating apparatus of claim 2, wherein the measurement unit calculates a phase change of the light, and determines the coupling state of the shower head and the upper electrode based on the phase change of the light.

4. The substrate treating apparatus of claim 2, wherein the optical fiber is interposed between a lower groove formed on an upper surface of the shower head and an upper groove formed on a lower surface of the upper electrode.

5. The substrate treating apparatus of claim 2, wherein the optical fiber is disposed in a lower groove formed on an upper surface of the shower head in a spiral shape.

6. The substrate treating apparatus of claim 4, wherein a sum of a depth of the upper groove and a depth of the lower groove is smaller than a diameter of the optical fiber.

7. The substrate treating apparatus of claim 6, wherein the optical fiber is partially deformed by partially providing a pressure to the optical fiber when the shower head and the upper electrode are coupled to each other.

8. The substrate treating apparatus of claim 6, wherein sections of the upper groove and the lower groove have partial shapes of ellipses extending in a widthwise direction of the shower head and the upper electrode.

9. The substrate treating apparatus of claim 6, wherein the depth of the lower groove is larger than the depth of the upper groove.

10. An inspection method comprising:
inspecting a coupling state of a shower head and an upper electrode by an optical fiber interposed between the shower head and the upper electrode,
wherein the inspecting the coupling state includes:
irradiate light to the optical fiber;
detecting the light irradiated to the optical fiber; and
monitoring the coupling state of the shower head and the upper electrode by using the light.

11. The inspection method of claim 10, wherein the monitoring of the coupling state includes:
calculating a phase change of the detected light; and
determining the coupling state of the shower head and the upper electrode based on the phase change of the light.

12. The inspection method of claim 11, wherein the monitoring of the coupling state is performed before the shower head and the upper electrode are coupled to each other and a process is executed.

13. The inspection method of claim 11, wherein the monitoring of the coupling state is performed while the substrate is treated by supplying the gas to the substrate after the shower head and the upper electrode are coupled to each other.

14. The inspection method of claim 13, wherein the supply of the gas is stopped when the coupling state of the shower head and the upper electrode is abnormal.

15. A substrate treating apparatus comprising:
a process chamber having a treatment space in the interior thereof;
a support unit located in the process chamber to support a substrate;
a gas supply unit configured to supply a process gas into the interior of the process chamber;
a plasma generating unit configured to generate plasma by using the process gas;
a ring assembly including an insulation ring that surrounds a circumference of the support unit and a focusing ring that concentrates the plasma on the substrate; and
an inspection unit configured to inspect a coupling state of the insulation ring and the focusing ring while an optical fiber is interposed between the insulation ring and the focusing ring.

16. An inspection method comprising:
inspecting a coupling state of an insulation ring and a focusing ring by an optical fiber interposed between the insulation ring and the focusing ring,
wherein the inspecting the coupling state includes:
irradiate light to the optical fiber;
detecting the light irradiated to the optical fiber; and
monitoring the coupling state of the insulation ring and the focusing ring by using the light.

* * * * *